US011839029B1

(12) United States Patent
Kartadinata et al.

(10) Patent No.: US 11,839,029 B1
(45) Date of Patent: Dec. 5, 2023

(54) SLIDER-BASED HBA INTERNAL LOCK

(71) Applicant: Hewlett Packard Enterprise Development LP, Houston, TX (US)

(72) Inventors: Warren A. Kartadinata, Fremont, CA (US); Neil Jefferson Asmussen, Houston, TX (US); Vance B. Murakami, Los Gatos, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 11 days.

(21) Appl. No.: 17/752,634

(22) Filed: May 24, 2022

(51) Int. Cl.
*H05K 1/18* (2006.01)

(52) U.S. Cl.
CPC ... *H05K 1/181* (2013.01); *H05K 2201/10189* (2013.01); *H05K 2201/10265* (2013.01); *H05K 2201/10272* (2013.01); *H05K 2201/10393* (2013.01); *H05K 2201/10515* (2013.01); *H05K 2201/10537* (2013.01)

(58) Field of Classification Search
CPC ......... H05K 1/181; H05K 2201/10265; H05K 2201/10272; H05K 2201/10393; H05K 2201/10515; H05K 2201/10537
USPC ........................................................ 174/250
See application file for complete search history.

(56) References Cited

U.S. PATENT DOCUMENTS

| 5,443,395 | A | 8/1995 | Wang | |
|---|---|---|---|---|
| 2002/0125039 | A1* | 9/2002 | Marketkar | H04L 25/12 174/250 |
| 2019/0350352 | A1 | 11/2019 | Chou et al. | |

FOREIGN PATENT DOCUMENTS

| CN | 105937533 A | 9/2016 |
|---|---|---|
| JP | 2008166402 A | * 7/2008 |

OTHER PUBLICATIONS

Fivetech Technologies Inc., "Horn Looking SMT slide lock", available online at <https://www.youtube.com/watch?v=vhaC3xk-r3U &t=3s>, Jan. 26, 2021, 10 pages.
Fivetech Technologies Inc., "Slide Lock", available online at <https://www.fivetk.com/products_overview_detail_page/index.php?id=80 &m_id=13&s_id=>, Jul. 30, 2018,1 page.
Fivetech Technologies Inc., "Spring Lock Ejector", available online at <https://www.youtube.com/watch?v=zMRRQiLnjio>, Feb. 18, 2022, 12 pages.

* cited by examiner

*Primary Examiner* — Andargie M Aychillhum
(74) *Attorney, Agent, or Firm* — Yao Legal Services, Inc.

(57) ABSTRACT

One aspect provides an apparatus for locking circuit boards in position between a pair of guide rails. The apparatus can include a slider attached to a sidewall of one guide rail. The slider is allowed to slide along the guide rail within a predetermined range and one or more plunger-and-spring assemblies. A respective plunger-and-spring assembly comprises a plunger and a spring surrounding the plunger, and the plunger is inserted into a through-hole on the sidewall of the guide rail such that a first end of the plunger can be aligned with a notch on a corresponding circuit board and a second end of the plunger is in contact with the slider. Sliding of the slider causes the spring to compress and decompress and the first end of the plunger to move in and out of the notch on the circuit board, thereby facilitating locking and unlocking of the circuit board.

20 Claims, 8 Drawing Sheets

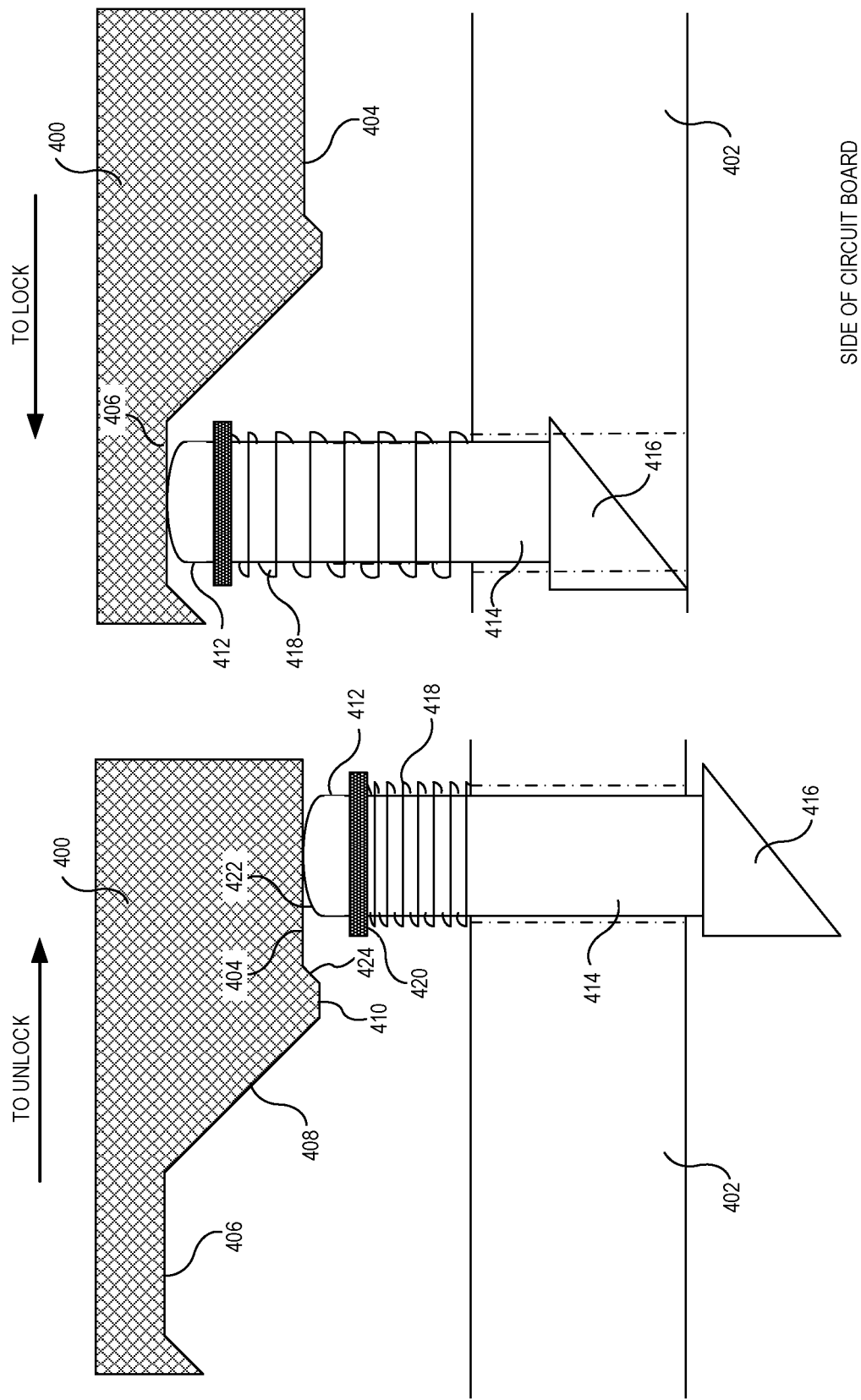

SLIDER-BASED HBA INTERNAL LOCK

BACKGROUND

This disclosure is generally related to a locking mechanism for locking circuit boards in position. More specifically, the locking mechanism is side mounted and can include a pull rod to facilitate front access.

BRIEF DESCRIPTION OF THE FIGURES

FIG. 4A illustrates the amplified view of the chamber roofs and plunger-and-spring assembly when the slider lock is in the locked state, according to one aspect.

FIG. 4B illustrates the amplified view of the chamber roofs and plunger-and-spring assembly when the slider lock is in the unlocked state, according to one aspect.

In the figures, like reference numerals refer to the same figure elements.

DETAILED DESCRIPTION

The following description is presented to enable any person skilled in the art to make and use the examples and is provided in the context of a particular application and its requirements. Various modifications to the disclosed examples will be readily apparent to those skilled in the art, and the general principles defined herein may be applied to other examples and applications without departing from the spirit and scope of the present disclosure. Thus, the scope of the present disclosure is not limited to the examples shown but is to be accorded the widest scope consistent with the principles and features disclosed herein.

The ever-increasing computing and storage demands have led to the continuous growth of component density in computer servers, and there is progressively less space to install add-in cards and devices that may be necessary for a specific application. For example, a chassis may use input/output modules (IOMs) to meet the input/output needs of the storage nodes mounted on the chassis, and each IOM may require up to four hot-swappable host bus adaptor (HBA) cards, which connect host systems to corresponding storage devices. Because the IOM is typically placed in a 1U chassis, the four HBA cards cannot fit on the same plane. One solution is to stack two HBA cards together (i.e., by placing one HBA card on top of another). However, this HBA-stacking configuration presents a challenge for enabling hot swapping of the HBA cards, because conventional mechanisms for locking and unlocking the HBA cards are top-mounted. When multiple (e.g., two) HBA cards are stacked in a 1U input/output module (IOM) chassis, the conventional top-mounted locking mechanism can no longer be applicable.

The present disclosure describes a locking mechanism for locking host bus adaptor (HBA) cards in position between a pair of guide rails. The proposed internal locking mechanism can be mounted on the side of a guide rail and can include a slider and one or more plunger-and-spring assemblies. The slider can be attached (e.g., via snap-fit latches) to the side of the guide rail and can include one or more chambers for receiving the plunger-and-spring assemblies. Each chamber can include a lower roof and an upper roof, with the upper roof being further away from the guide rail than the lower roof. When an HBA card is inserted into a slot on the guide rails, one end of the plunger can be inserted, via a through-hole on the guide rail, into a notch on the HBA card, locking the HBA card in position, and the other end of the plunger can be pressed, by the spring, against the lower roof of the corresponding slider chamber. When the slider slides along the guide rail, the compressed spring can push the plunger to glide along an internal ramp within the slider until the plunger is in contact with the upper roof of the chamber, thus causing the plunger to retract from the notch on the HBA card to unlock the HBA card.

Figure 1:
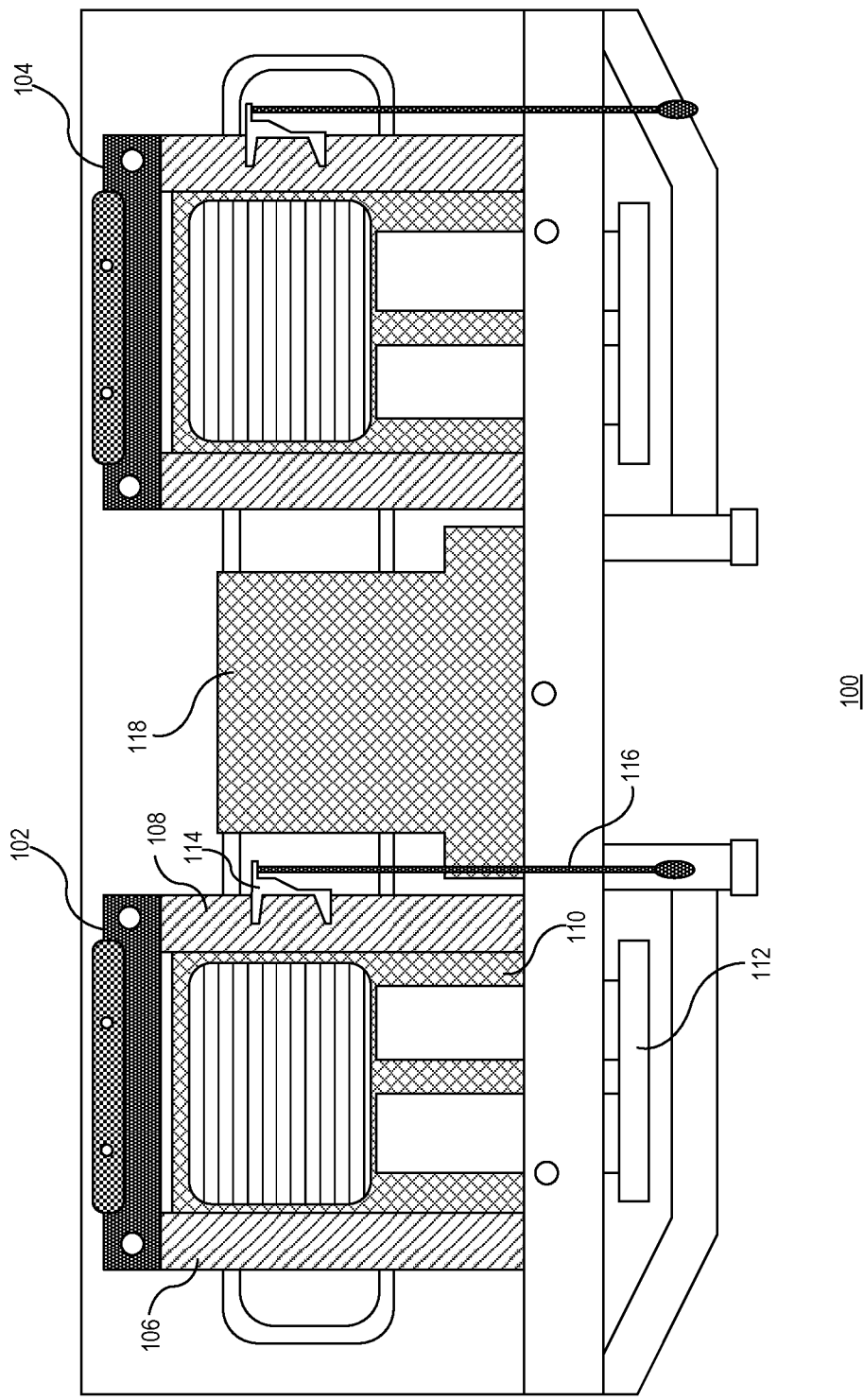
FIG. 1 presents a diagram illustrating a partial top view of an input/output module (IOM) with a locking mechanism, according to one aspect of the application.

FIG. 1 presents a diagram illustrating a partial top view of an input/output module (IOM) with a locking mechanism, according to one aspect of the application. In FIG. 1, an IOM 100 can include a pair of HBA sub-assemblies 102 and 104. Each sub-assembly can include a pair of guide rails for holding one or more HBA cards. For example, HBA sub-assembly 102 can include guide rails 106 and 108 that can hold a number of HBA cards, including HBA card 110. Note that additional HBA cards can be placed below HBA card 110 and are not shown in FIG. 1. FIG. 1 also shows that each HBA card can be coupled to a handle for pushing or pulling the HBA card along the guide rails when the HBA card is replaced. For example, HBA card 110 can be coupled to a handle 112, which can be used to pull HBA card 110 out of HBA sub-assembly 102 from the front of IOM module 100 when HBA card 110 is replaced.

Because the HBA card can slide along the guide rails to facilitate the hot swapping or service operation, a locking mechanism can be used to lock the HBA card in position when it is in service. In conventional systems where the HBA cards are on the same plane and not stacked, a locking mechanism can be mounted above the HBA card to lock the HBA card in position (e.g., via a notch on the HBA card). However, when multiple HBA cards are stacked, the top-mounted locking mechanism may no longer be applicable. More specifically, given the limited vertical spacing of the 1U IOM chassis (which can be, in one example, approximately 38.7 mm considering the sheet metal thickness of the top and bottom covers of the IOM chassis), a top-mounted locking mechanism may not fit in the 1U IOM chassis.

To facilitate locking/unlocking of the stacked HBA cards, a side-mounted locking mechanism can be applied to access and lock the stacked HBA cards from the side. According to one aspect, each HBA sub-assembly can include a slider lock attached to the side of its guide rail to lock the stacked HBA cards. To facilitate front access to the slider lock, a pull rod can be attached to the slider lock. For example, FIG. 1 shows a side-mounted slider lock 114 attached to the side of guide rail 108 of HBA sub-assembly 102. Side-mounted slider lock 114 can lock the stacked HBA cards, including HBA card 110, in HBA sub-assembly 102 such that, when locked, the HBA cards can be prevented from sliding along guide rails 106 and 108. A pull rod 116 accessible at the front panel of IOM 100 is coupled to side-mounted slider lock 114. Pull rod 116 can be made of a plastic material (e.g., polytetrafluoroethylene (PTFE), polyvinyl chloride (PVC), etc.). The length of pull rod 116 can be determined based on the depth of the 1U IOM chassis. Pull rod 116 can typically have an elongated body and a handle allowing a user to grasp and pull on the handle. The handle can have various shapes and sizes. Pull rod 116 can be attached to slider lock 114 using a suitable attachment mechanism (e.g., by using a screw). According to one aspect, to pull HBA card 110 from sub-assembly 102, a user can pull/push pull rod 116 to place side-mounted slider lock 114 in an unlocked state.

FIG. 1 also shows a circuit board 118 positioned between HBA sub-assemblies 102 and 104. Because circuit board 118 is typically not hot swappable, its position can be fixed, and an additional locking mechanism might not be necessary. Note that FIG. 1 only shows a portion of components within IOM 100. Additional components, such as a motherboard, are not shown.

Figure 2A:
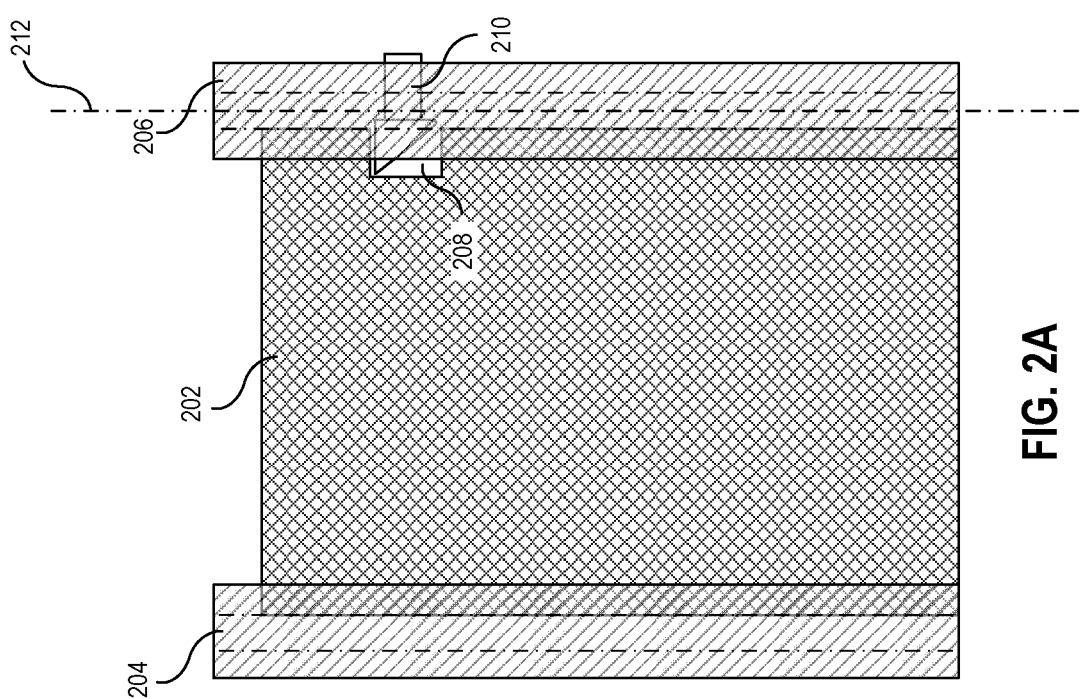
FIGS. 2A-2B illustrate the operation principle of the locking mechanism, according to one aspect of the application.
Figure 2B:
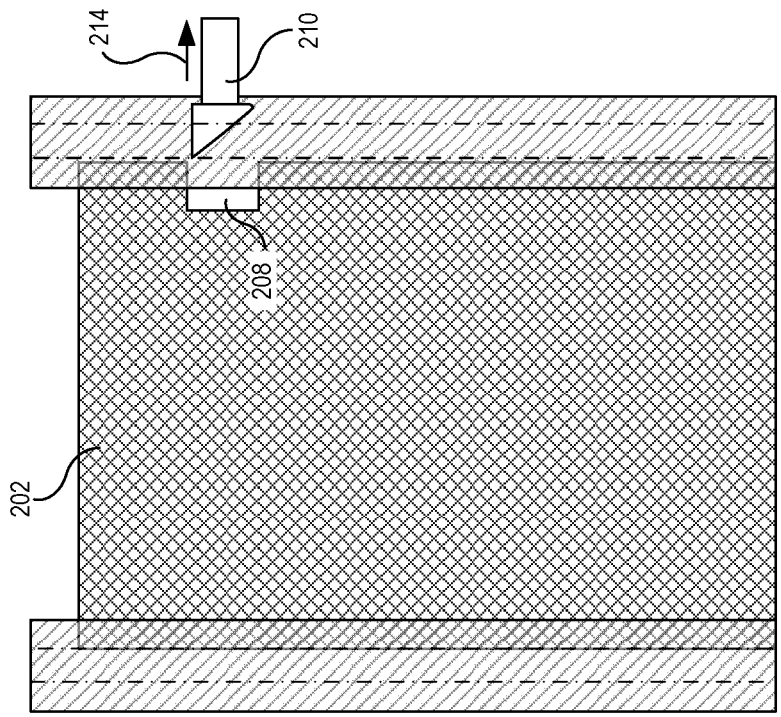

FIGS. 2A-2B illustrate the operation principle of the locking mechanism, according to one aspect of the application. More specifically, FIG. 2A and FIG. 2B each show the top view of the HBA sub-assembly comprising the HBA card and the guide rails. According to one aspect, the HBA card can comply with the Open Compute Project (OCP) standard. For example, an OCP HBA card can have a well-defined dimension such as 16.8 cm×6.9 cm. FIG. 2A shows an OCP HBA card 202 positioned between guide rails 204 and 206. Each of the guide rails can include a slot (defined by the dashed lines), allowing a corresponding edge of OCP HBA card 202 to be inserted in the slot. OCP HBA card 202 can then slide along the guide rails, thus facilitating hot swapping of HBA card 202. FIG. 2A also shows that HBA card 202 can include, on one of its longer edges, a notch 208. The location and size of notch 208 can be based on the OCP standard. For example, an OCP HBA card can have one notch on each side, and the opening of the notch can be approximately 3.5 mm. The tip of a plunger 210 can be inserted, via a through-hole (not shown in FIG. 2A) on guide rail 206, into notch 208. Because plunger 210 is constrained by the through-hole on guide rail 206, when its tip is inserted into notch 208, HBA card 202 can be locked in position and prevented from sliding along the guide rails.

Although plunger 210 cannot move along a longitudinal direction (as indicated by a dashed line 212) of guide rail 206, it can move in a perpendicular direction. FIG. 2B shows that plunger 210 can move to the right, as indicated by an arrow 214, causing the tip of plunger 210 to retract from notch 208. When plunger 210 is retracted, HBA card 202 is free to move along the guide rails.

There can be various mechanisms that can be used to push and pull the plunger in and out of the notch on the HBA card in order to lock and unlock the HBA card. Some mechanisms, such as a push-pull lever, can be bulky or hard to operate. According to some aspects of the instant application, a compact slider can be used to push or pull the plunger. More specifically, the plunger and the slider can be coupled in such a way that sliding motions of the slider along the guide rail can be transformed to motions of the plunger moving in and out of the notch on the HBA card.

Figure 3A:
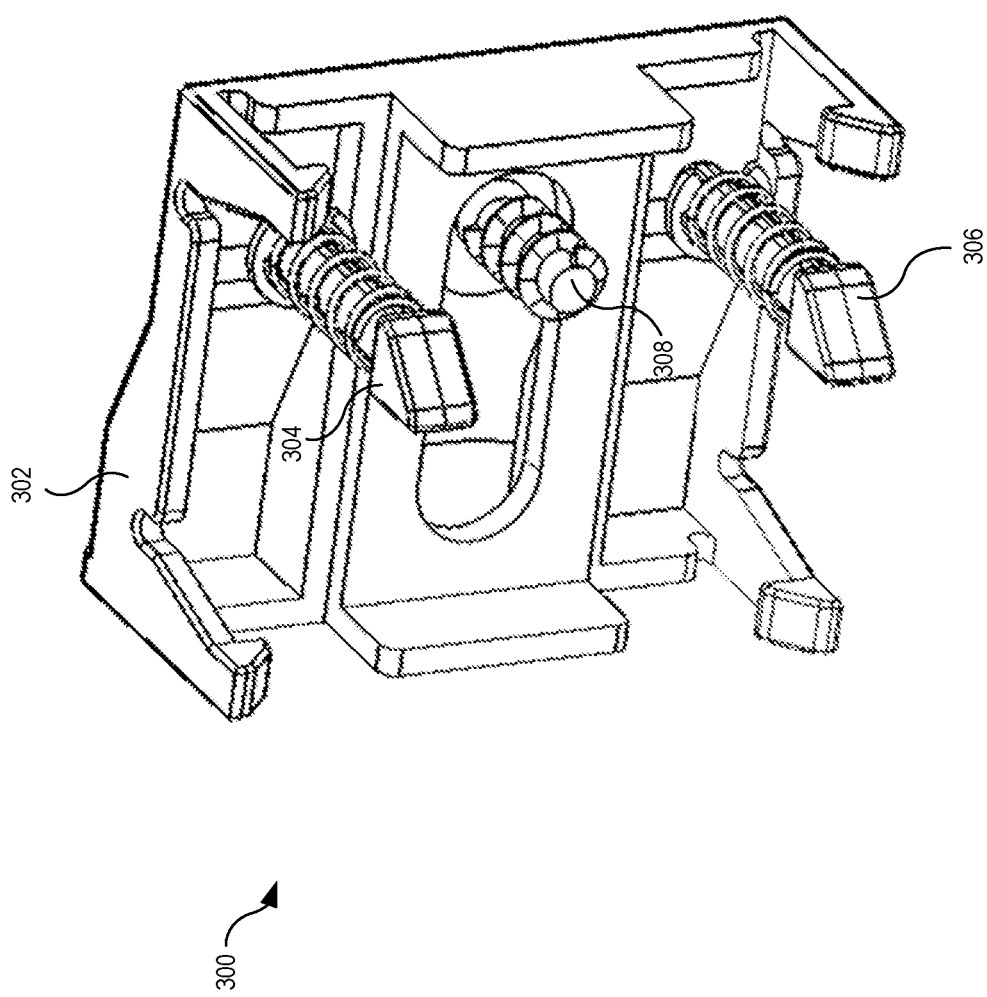
FIG. 3A illustrates a side-mounted slider lock for locking a pair of circuit boards in position, according to one aspect of the instant application.

FIG. 3A illustrates a side-mounted slider lock for locking a pair of circuit boards in position, according to one aspect of the instant application. Slider lock 300 can include a slider 302, a pair of plunger-and-spring assemblies 304 and 306, and a screw 308. According to one aspect, when slider 302 moves along the guide rail, plunger-and-spring assemblies 304 and 306 can move in a direction perpendicular to the guide rail, meaning that plunger-and-spring assemblies 304 and 306 can move in and out of the notches on the corresponding circuit boards, locking and unlocking the circuit boards.

Figure 3B:
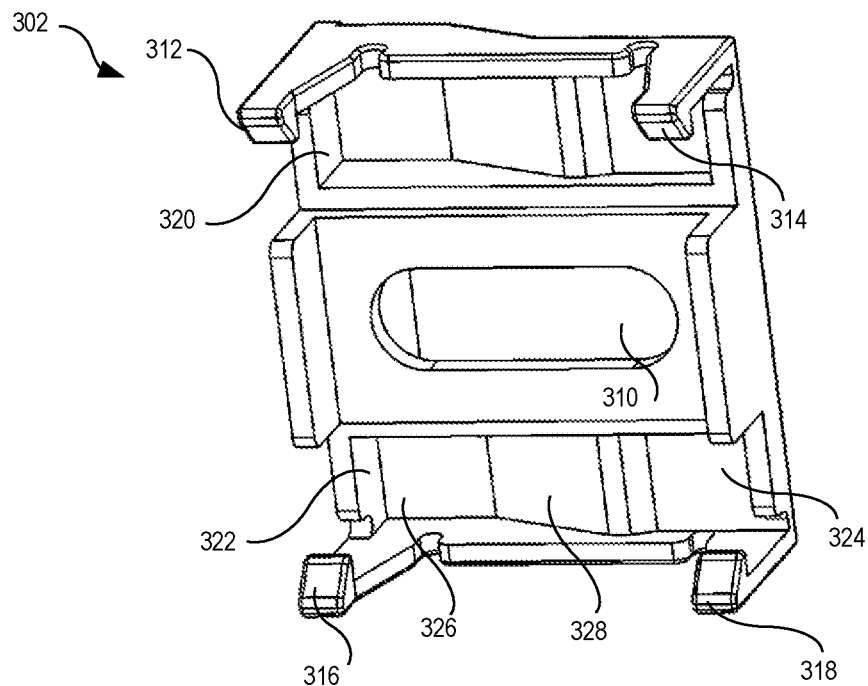
FIG. 3B illustrates a slider of the slider, according to one aspect of the instant application.

FIG. 3B illustrates a slider of the slider lock, according to one aspect of the instant application. Slider 302 can include a number of snap-fit latches used to attach slider 302 to the side of a guide rail. In the example shown in FIG. 3B, slider 302 can include, in its four corners, snap-fit latches 312, 314, 316, and 318. According to one aspect, the snap-fit latches can include snap-fitting hooks. More specifically, these snap-fit latches can snap onto edges of predefined slots on the guide rail to attach slider 302 to the guide rail. Moreover, the snap-fit latches and the edges of the predefined slots on the guide rail can have a smooth surface to allow slider 302 to slide along the guide rail with relative ease. Note that both slider 302 and the guide rail may be made of a rigid plastic material such as polytetrafluoroethylene (PTFE) or polyvinyl chloride (PVC). In addition to the snap-fitting hooks shown in FIG. 3B, slider 302 may use a different attachment mechanism to attach to the guide rail, so long as the attachment mechanism can allow slider 302 to slide along the guide rail. For example, other than the snap-fitting hooks, slider 302 can be attached to the guide rail via screws. In the example shown in FIG. 3B, in addition to those snap-fit latches, slider 302 can also include a slot 310 that allows a screw (i.e., screw 308 shown in FIG. 3A) to engage with a threaded hole on the guide rail to further bind slider 302 to the guide rail. Unlike a regular circular through-hole that fits the typical cylindrical body of a screw, slot 310 can have an elongated shape to allow slider 302 to slide along the length of slot 310. According to one aspect, slot 310 can have the shape of a rectangle with rounded corners or an eclipse. The sliding range of slider 302 can be determined by the length of slot 310, which can be between 5 and 20 mm (e.g., around 10 mm). In one example, the length of slot 310 can be between ½ and ⅔ of the length of slider 302.

Slider 302 can include a pair of chambers 320 and 322 for receiving the plunger-and-spring assemblies, with each chamber corresponding to a plunger-and-spring assembly. The shape of each chamber can be configured such that, when slider 302 slides along the guide rail, the plunger-and-spring assemblies can move in a direction perpendicular to the guide rail (i.e., move in and out of the notches on corresponding circuit boards). More specifically, each chamber can include a lower roof and an upper roof. When slider 302 is mounted on the side of the guide rail, the lower roof of each chamber can be closer to the guide rail than the upper roof of the chamber. This way, when slider 302 moves/slides to a position where the lower roof of each chamber is engaging (e.g., in direct contact) with the corresponding plunger-and-spring assembly, the tip of each plunger can be pushed into the notch on the circuit board to lock the circuit board. On the other hand, when slider 302 moves/slides to a position where the upper roof of each chamber is engaging (e.g., in direct contact) with the corresponding plunger-andspring assembly, the tip of each plunger can retract from the notch on the circuit board to unlock the circuit board. In the example shown in FIG. 3B, chamber 322 can include a lower roof 324, an upper roof 326, and a ramp 328 positioned between lower roof 324 and upper roof 326. Ramp 328 can allow the plunger-and-spring assembly to glide back and forth between lower roof 324 and upper roof 326.

Figure 3C:
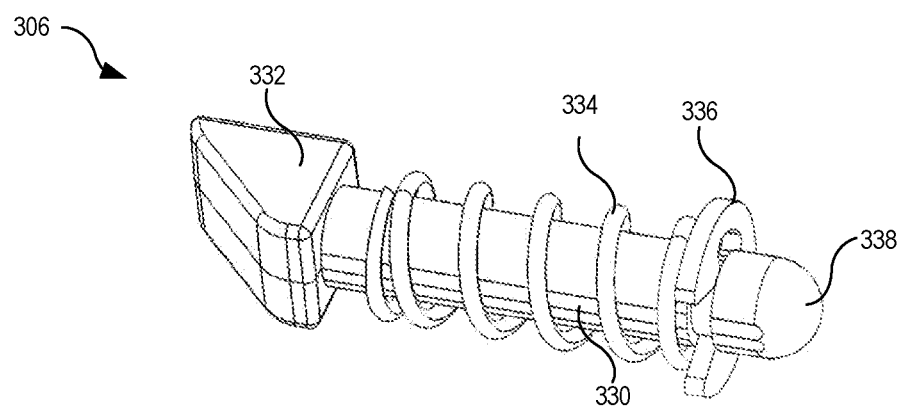
FIG. 3C illustrates a plunger-and-spring assembly of the slider lock, according to one aspect of the instant application.

FIG. 3C illustrates a plunger-and-spring assembly of the slider lock, according to one aspect of the instant application. Plunger-and-spring assembly 306 can include a plunger rod 330, a plunger head 332, a spring 334, and a spring retainer 336. Plunger rod 330 and plunger head 332 together form the plunger, which can be a unibody construction or two separate pieces assembled together. Plunger rod 330 can be cylindrical, and plunger head 332 can be wider than plunger rod 330 and can be substantially shaped like a right triangular prism. For example, plunger rod 330 can have a diameter between 1 and 5 mm, and the width of plunger head 332 can be between 20 and 50% larger than the diameter of plunger rod 330. The overall length of plunger-and-spring assembly 306 can be between 10 and 15 mm. Plunger head 332 can essentially serve as the locking feature of the slider lock, and its entering into and exiting from the notch on the circuit board can result in the locking and unlocking of the circuit board. In addition to the right triangular cylinder shape shown in FIG. 3C, plunger head 332 can also have different shapes, such as a cube or rectangular prism. The size of plunger head 332 can be configured depending on the size of the notch (e.g., notch 208 in FIG. 2A or 2B) on the circuit board. For example, plunger head 332 can have a width slightly smaller than the width of the notch to allow it to enter or exit the notch with ease. On the other hand, plunger head 332 cannot be so small as to prevent it from locking the circuit board securely. The notch can be a few milliliters (e.g., between 2 and 10 mm) wide, and plunger head 332 can have roughly the same width. According to one aspect, the plunger, including plunger rod 330 and plunger head 332, can be made of metal, such as die-cast aluminum, die-cast zinc, etc. Note that the free end (i.e., the end opposite from plunger head 332) of plunger rod 330 can have a dome-shaped surface 338, which can reduce the friction between the plunger and the inner surface of slider 302 when slider 302 slides along the guide rail. Dome-shaped surface 338 can be half of a sphere or less than half of a sphere. The diameter of the sphere can be between 1 and 10 mm. Alternatively, dome-shaped surface 338 can be a paraboloid dome.

Spring 334 can surround plunger rod 330. FIG. 3C also shows that spring 334 can be confined by spring retainer 336. In the example shown in FIG. 3C, spring retainer 336 can be a c-shaped washer (metal or plastic) attached to rod 330 via a groove near the free end of rod 330. In a different example, spring retainer 336 can be a built-in spring retainer of rod 330. In such a case, plunger head 332 can be a separate piece that can be removed from rod 330 to allow the passage of rod 330 from one side of the guide rail to the other via a through-hole on the guide rail. When the slider lock is installed, spring 334 can be confined between spring retainer 336 and the guide rail.

FIG. 4A illustrates the amplified view of the chamber roofs and plunger-and-spring assembly when the slider lock is in the locked state, according to one aspect. More specifically, FIG. 4A shows the partial view of a slider 400 and a guide rail 402. The inner surface (i.e., the surface facing guide rail 402) of slider 400 can include a lower chamber roof 404, an upper chamber roof 406, a ramp 408, and a bump 410. FIG. 4A also shows a plunger-and-spring assembly that can include a plunger 412 (which includes a rod 414 and a head 416), a spring 418, and a spring retainer 420. Rod 414 can be inserted into a through-hole on guide rail 402. The length of rod 414 and the distance between lower chamber roof 404 and guide rail 402 can be configured such that, when the free end of rod 414 is in direct contact with lower chamber roof 404, head 416 can extend beyond the inner surface (i.e., the surface facing the circuit board) of guide rail 402. Like the example shown in FIG. 2A, head 416 of plunger 412 can enter the notch on the circuit board held by guide rail 402, locking the circuit board in position.

As shown in FIG. 4A, when the slider lock is in this locked state, spring 418 surrounding rod 414 can be compressed by spring retainer 420 and the outer surface of guide rail 402. This is because the diameter of spring 418 is greater than that of the through-hole on guide rail 402 and smaller than that of spring retainer 420. In this case, compressed spring 418 can push plunger 412 against lower chamber roof 404.

To release the lock or to retract head 416 from the notch on the circuit board, one can slide slider 400 to the right, i.e., in a direction pointing from upper chamber roof 406 to lower chamber roof 404, as indicated by the arrow above slider 400. In this example, the front panel of the circuit board sub-assembly is on the right side, meaning that the circuit board is loaded/unloaded from the right. As slider 400 slides along guide rail 402, the free end of rod 414 can glide on the inner surface of slider 400. As shown in FIG. 4A, the free end of rod 414 can have a dome-shaped surface 422, which can significantly reduce the amount of friction between the inner surface of slider 400 and rod 414. As slider 400 slides to the right, slope 424 connecting bump 410 and lower chamber roof 404 may push down plunger 412 (i.e., which further compresses spring 418) to allow bump 410 to pass plunger 412. Note that bump 410 is configured to prevent the unintentional movement of slider 400. External forces are needed to move slider 400 past plunger 412. The height and slope of bump 410 can be carefully designed such that slider 400 may not pass plunger 412 without a reasonable amount of force (e.g., forces of a few newtons) applied onto slider 400 (e.g., a user pulling slider 400 to the right). In one example, the height of bump 410 (with respect to lower chamber roof 404) can be between one and two times of the radius of the dome-shaped end surface of rod 414, and a minimum amount of force needed to push or pull slider 400 to pass bump 410 can be between 2 and 10 N.

When bump 410 of slider 400 passes plunger 412, compressed spring 418 can start to decompress, pushing plunger 412 against slider 400. As slider 400 continues to slide to the right, plunger 412 can be pushed by spring 418 to glide over ramp 408 until it reaches upper chamber roof 406. When plunger 412 is in direct contact with upper chamber roof 406, the slider lock is in the unlocked state.

FIG. 4B illustrates the amplified view of the chamber roofs and plunger-and-spring assembly when the slider lock is in the unlocked state, according to one aspect. Like FIG. 4A, FIG. 4B shows the partial view of a slider 400 and a guide rail 402. More specifically, FIG. 4B shows that the free end of rod 414 of plunger 412 is now in direct contact with upper chamber roof 406. As can be seen by comparing FIG. 4B with FIG. 4A, the difference in height between upper chamber roof 406 and lower chamber roof 404 can cause plunger 412 to move upward, retracting head 416 into the through-hole on guide rail 402. Like the example shown in FIG. 2B, head 416 of plunger 412 can exit the notch on the circuit board held by guide rail 402, unlocking the circuit board (i.e., allowing the circuit board to slide freely along guide rail 402). In this unlocked state, spring 418 can be uncompressed.

When the slider lock is placed in the unlocked state, a user can remove the old circuit board from the slot on the guide rails and insert a new circuit board into the slot. To lock the new circuit board in position, the user can push/pull slider 400 to the left (as indicated in FIG. 4B by the arrow above slider 400) to push down plunger 412 and compress spring 418 until plunger 412 is in contact with lower chamber roof 404 and plunger head 416 is pushed into the notch on the new circuit board. According to some aspects, a user may need to apply a force on slider 400 in order to compress spring 418. The minimum amount of force needed to compress spring 418 can be between 2 and 10 N.

In the example shown in FIGS. 4A-4B, the front panel of the sub-assembly is on the right side of the drawing and slider 400 can move from a locked position to an unlocked position by sliding to the right (or toward the front panel). When a pull rod accessible from the front panel is used (e.g., as shown in FIG. 1), a user can pull forward the pull rod to unlock the circuit board and push backward the pull rod to lock the circuit board. If there is no pull rod, the user may need to remove the top cover of the 1U IOM to pull slider 400 forward to unlock the circuit board or push slider 400 backward to lock the circuit board.

Figure 4D:
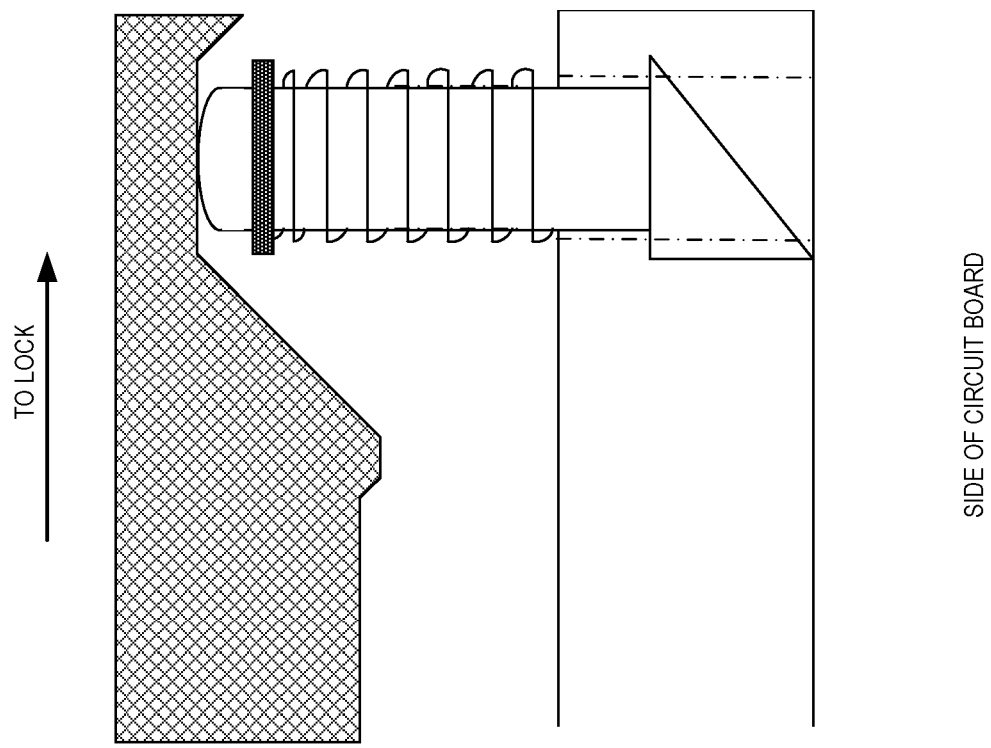
FIG. 4D illustrates the amplified view of the chamber roofs and plunger-and-spring assembly when the slider lock is in the unlocked state, according to one aspect.
Figure 4C:
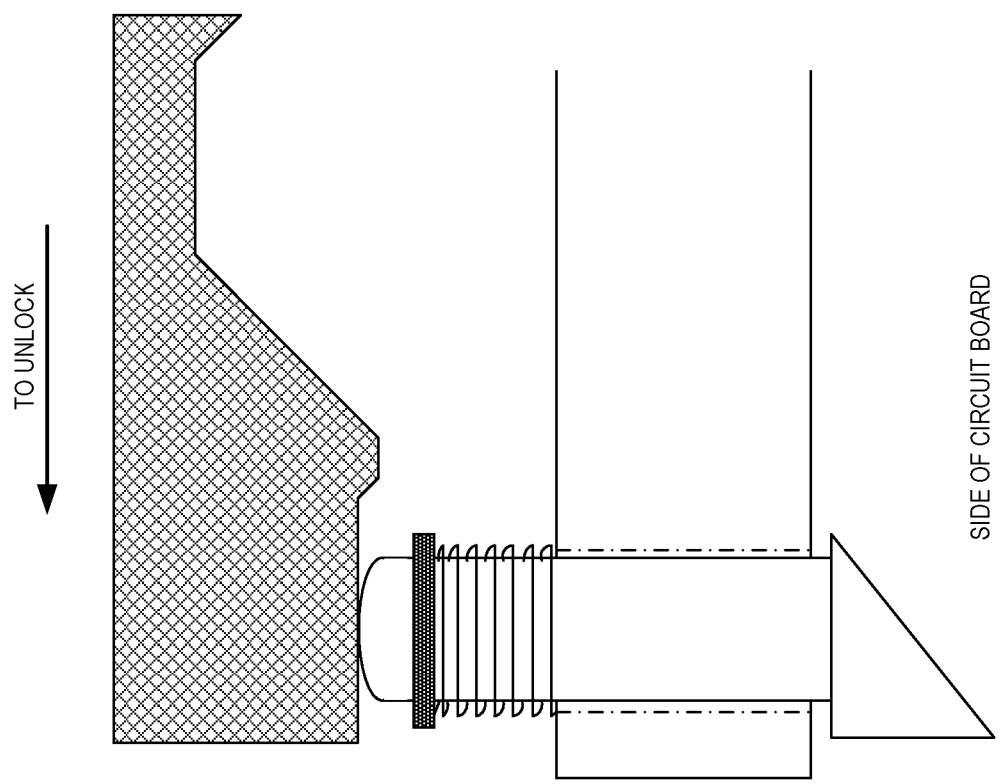
FIG. 4C illustrates the amplified view of the chamber roofs and plunger-and-spring assembly when the slider lock is in the locked state, according to one aspect.

It is also possible to configure the slider lock differently such that a user can push the slider backward to unlock the circuit board and pull it forward to lock the circuit board. FIG. 4C illustrates the amplified view of the chamber roofs and plunger-and-spring assembly when the slider lock is in the locked state, according to one aspect. FIG. 4C is very similar to FIG. 4A, except that the slider has been configured in such a way that unlocking the slider lock requires the slider to move to the left, as indicated by the arrow above the slider. If the front panel is to the right side of the drawing, unlocking the slider lock can require a push motion from the user. FIG. 4D illustrates the amplified view of the chamber roofs and plunger-and-spring assembly when the slider lock is in the unlocked state, according to one aspect. FIG. 4D is very similar to FIG. 4B, except that the slider has been configured in such a way that locking the slider lock can require the slider to move to the right, as indicated by the arrow above the slider. If the front panel is to the right side of the drawing, locking the slider lock can require a pull motion from the user. Like the example shown in FIGS. 4A-4B, a user can apply a force on the slider to push or pull the slider in order to unlock or lock the circuit board. The minimum amount of force applied on the slider can be between 2 and 10 N.

Figure 5A:
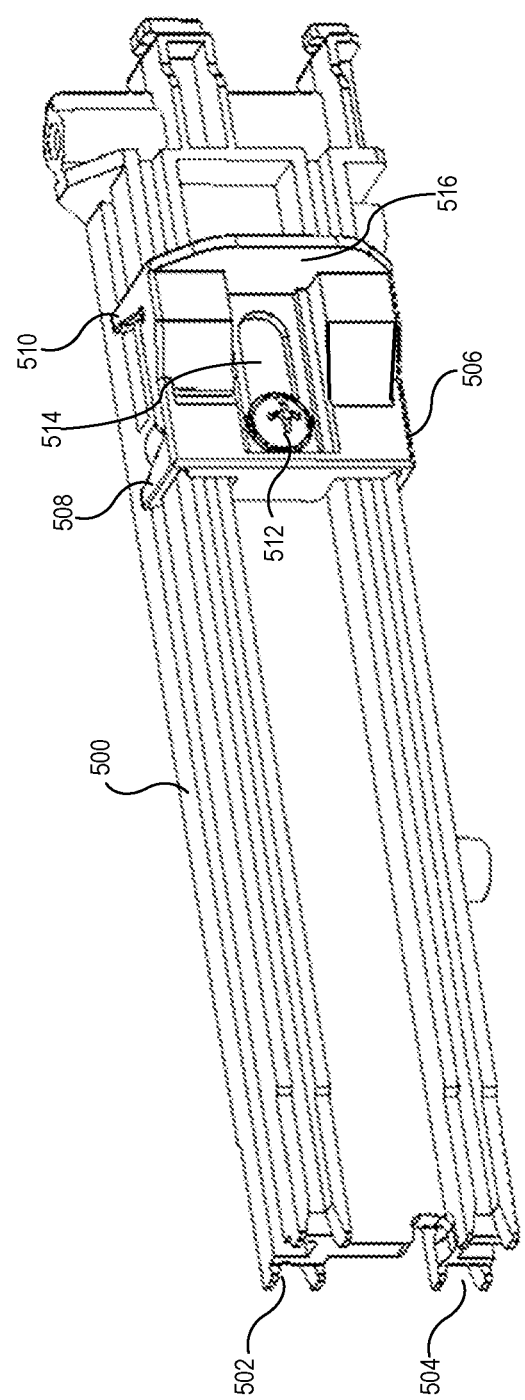
FIG. 5A illustrates a slider lock installed on the side of a guide rail, according to one aspect of the instant application.

FIG. 5A illustrates a slider lock installed on the side of a guide rail, according to one aspect of the instant application. In FIG. 5A, a guide rail 500 can include a pair of slots (e.g., slots 502 and 504) for receiving circuit boards, one slot per board. In this example, the HBA sub-assembly can fit two stacked HBA cards. FIG. 5A also shows a slider 506 attached to the external sidewall (the sidewall facing away from the circuit boards) of guide rail 500. More specifically, slider 506 can be attached to guide rail 500 by a number of snap-fit latches (e.g., latches 508 and 510). In addition to the snap-fit latches, a screw 512 can also be used to bind slider 506 to the sidewall of guide rail 500. Note that the snap-fit latches and screw 512 do not rigidly fix the position of slider 506. Instead, slider 506 can slide along guide rail 500 within a range. The movement range of slider 506 can be defined by the location of screw 512 and a slot 514 on slider 506. Slider 506 can move between a first position where screw 512 is in contact with one end of slot 514 and a second position where screw 512 is in contact with the opposite end of slot 514. According to one aspect, the slider lock can be in a locked state when slider 506 is moved to the first position and in an unlocked state when slider 506 is moved to the second position, or vice versa. FIG. 5A also shows that slider 506 can include a handle 516. A user can pull/push slider 506 along guide rail 500 by holding handle 516 and applying a pulling/pushing force. According to some aspects, a pull rod (not shown in FIG. 5A) can be attached to handle 516 to allow access to the slider lock from the front panel of the circuit board sub-assembly. For example, by pulling/pushing the pull rod, a user can pull/push slider 506, without the need to open the top cover of the 1U IOM chassis. Various coupling mechanisms can be used to attach the pull rod to handle 516, including but not limited to: using snap-fit latches, using screws, glue, solder, etc.

Figure 5C:
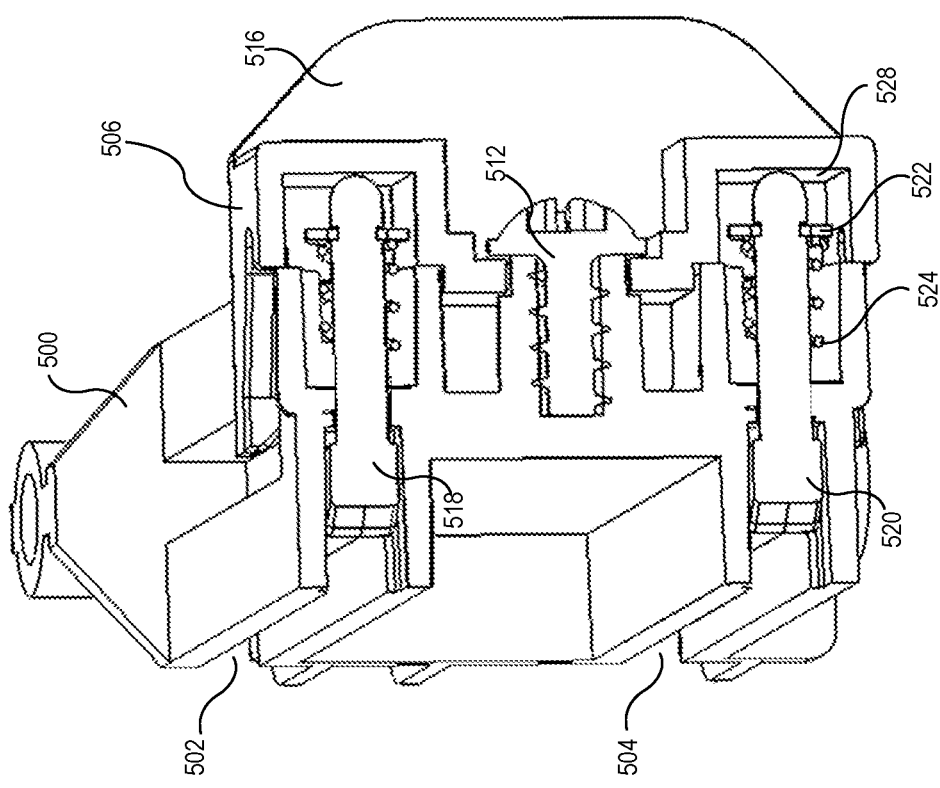
FIG. 5C illustrates the cross section of the slider lock and guide rail when the lock is in the unlocked state, according to one aspect of the instant application.
Figure 5B:
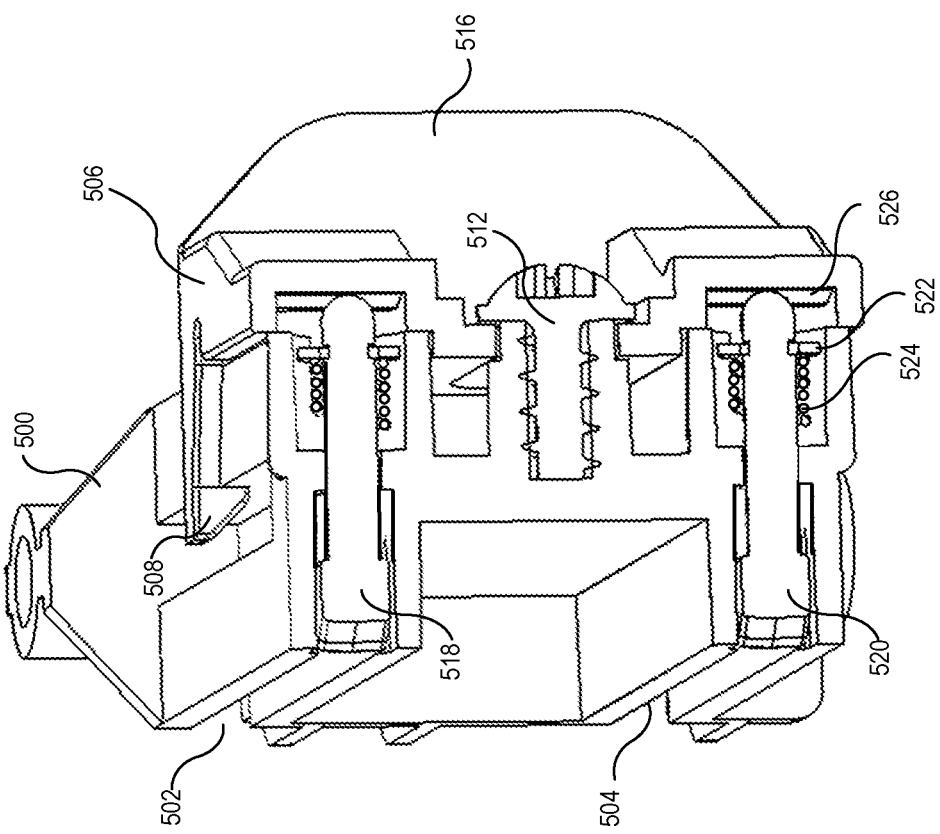
FIG. 5B illustrates the cross section of the slider lock and guide rail when the lock is in the locked state, according to one aspect of the instant application.

FIG. 5B illustrates the cross section of the slider lock and guide rail when the lock is in the locked state, according to one aspect of the instant application. In FIG. 5B, slider 506 is placed in a position such that the slider lock is in the locked state. More specifically, FIG. 5B shows that plungers 518 and 520 are in contact with the lower roof of their corresponding chambers such that their plunger heads are extended into slots 502 and 504, respectively. Like the example shown in FIG. 2A, extended plungers 518 and 520 can lock circuit boards inserted into slots 502 and 504 in position. When slots 502 and 504 are empty with no inserted circuit board, extended plungers 518 and 520 can prevent the insertion of circuit boards into slots 502 and 504.

FIG. 5B also shows the sideview of snap-fit latch 508 and the cross section of screw 512. In this example, snap-fit latch 508 comprises a snap-fitting hook that can hook to a pre-defined groove on guide rail 500. The smooth interface between the hook and the groove can allow slider 506 to slide along guide rail 500.

FIG. 5B also shows the cross-sectional view of the spring retainer attached to each plunger and the spring surrounding each plunger (e.g., spring retainer 522 attached to plunger 520 and spring 524 surrounding plunger 520). As shown in FIG. 5B, the diameter of the through-hole on guide rail 500 can be slightly larger than the diameter of the rod of plunger 520 but slightly smaller than that of spring 524 such that the rod of plunger 520 can pass through the through-hole but spring 524 can be sandwiched between the external wall of guide rail 500 and spring retainer 522. For example, the diameter of the through-hole can be between 5 and 20% larger than the diameter of the rod of plunger 520, and the diameter of spring 524 can be between 5 and 10% larger than the diameter of the through-hole. In the example shown in FIG. 5B, the slider lock is in the locked state and the free ends of the plungers are in direct contact with the lower chamber roofs. For example, the free end of plunger 520 can be pushed against lower chamber roof 526 by spring 524, and spring 524 can be compressed between the external wall of guide rail 500 and spring retainer 522.

According to FIG. 5B, installing the slider lock can include inserting, from the inner side (i.e., the left side) of guide rail 500, the plunger rods of plungers 518 and 520, into the through-holes on guide rail 500; placing, from the outer side (i.e., the right side) of guide rail 500, the springs (e.g., spring 524) around the extruded portion of the plunger rods; installing the spring retainers (e.g., spring retainer 522) on the plunger rods; and then covering the plunger rods with slider 506 and attaching slider 506 to the sidewall of guide rail 500. Note that attaching slider 506 can include pushing the snap-fit latches (e.g., latch 508) into position and driving screw 512 into the preset screw hole on guide rail 500.

FIG. 5C illustrates the cross section of the slider lock and guide rail when the lock is in the unlocked state, according to one aspect of the instant application. In FIG. 5C, the slider lock is in an unlocked state, where plungers 518 and 520 have retracted from the slots on guide rail 500. For example, plunger 518 is retracted from slot 502, and plunger 520 is retracted from slot 504. FIG. 5C also shows that the retraction of the plungers can be caused by the decompressed springs pushing the plungers toward slider 506. In this case, the decompressed springs can push the plungers into direct contact with the upper chamber roofs. For example, decompressed spring 524 can push the free end of plunger 520 against upper chamber roof 528. As can be seen by comparing FIG. 5C with FIG. 5B, upper chamber roof 528 can be further away from guide rail 500 than lower chamber roof 526. This increased distance can allow for the retraction of the plunger heads.

In the examples shown in FIGS. 5A-5C, the slider lock can simultaneously lock/unlock two circuit boards held by the guide rails. In other words, a single slider lock operates for both slots. This is advantageous for the 1U IOM due to the compact design of the slider lock. In cases where the vertical clearance is larger, it is also possible to use separate slider locks for the different circuit-board-receiving slots. Each individual slider lock can include its own sliding handle to receive actuations independently. This way, circuit boards in the multiple (e.g., two) slots can be locked/unlocked independently of each other. Alternatively, to conserve space, the two sliding handles can be positioned on opposite ends of the slider locks. In the example shown in FIG. 5A, the sliding handle is positioned at the far end of the slider. It is also possible to place the sliding handle at the near end of the slider. In cases where the circuit boards have notches on both edges, the slider locks for the two circuit-board-receiving slots may be attached to opposite guide rails, one lock per guide rail.

Moreover, the pull-to-unlock configuration shown in FIGS. 4A-4B and the push-to-unlock configuration shown in FIGS. 4C-4D can be applied based on the practical need, as certain applications may prefer one configuration over the other. According to one aspect, it is also possible to mix and match the two configurations. For example, the slider lock attached to the upper slot on the guide rail may use one configuration (e.g., the pull-to-unlock configuration), whereas the slider lock attached to the lower slot on the guide rail may use a different configuration (e.g., the push-to-unlock configuration).

In general, this disclosure provides a solution to the problem of locking hot swappable circuit boards that are stacked on top of each other. More specifically, a slider lock can be used, where the sliding of a slider along a guide rail can cause plungers confined by the guide rail and the slider to move in and out of notches on circuit boards held between a pair of guide rails. Due to space constraints, the slider lock can be attached to the side of the guide rail, and the plungers can engage with circuit boards from the side (e.g., the plungers move in a plane parallel to the component-mounting surface of each circuit board). Because the chambers receiving the plungers have lower and upper roofs, the relative position between the plungers and the guide rail can change depending on whether the plungers are in contact with the lower or upper roofs, and such a relative position can determine whether the slider lock is in the locked or unlocked state. Throughout this disclosure, OCP HBA cards have been used as examples to describe the operation principles of the slider lock. In practice, the side-mounted slider lock can be used to lock any type of circuit board, as long as the circuit board includes a predefined notch to allow the head of the plunger to engage with the circuit board. In addition, the OCP HBA card has one notch for securing its position, whereas a different type of circuit board may have more than one notch (e.g., one notch on each edge). In such a case, there can be more than one (e.g., two) slider lock mounted on the guide rails (e.g., one lock per rail) to lock the circuit board. In addition, FIGS. 5A-5C show the guide rails accommodating two stacked circuit boards. In practice, fewer (e.g., one) or more (e.g., four) circuit boards may be held between a pair of guide rails, and one or more slider locks can be used to lock these circuit boards in position. Moreover, FIG. 3B shows a particular design of the slider. In practice, the shape and size of the slider may be different from what is shown in FIG. 3B. For example, different coupling mechanisms can be used to attach the slider to the guide rail. In addition, other than using a ramp to connect the upper and lower roofs, it is also possible for the interface between the upper and lower roofs to have a 90° angle or to include multiple steps.

One aspect of the instant application provides an apparatus for locking one or more circuit boards in position between a pair of guide rails. The apparatus can include a slider attached to a sidewall of one guide rail. The slider is allowed to slide along the guide rail within a predetermined range and one or more plunger-and-spring assemblies. A respective plunger-and-spring assembly comprises a plunger and a spring surrounding the plunger, and the plunger is inserted into a through-hole on the sidewall of the guide rail such that a first end of the plunger can be aligned with a notch on a corresponding circuit board and a second end of the plunger is in contact with the slider. Sliding of the slider causes the spring to compress and decompress and the first end of the plunger to move in and out of the notch on the circuit board, thereby facilitating locking and unlocking of the circuit board.

In a variation on this aspect, the slider can include one or more chambers for receiving the one or more plunger-and-spring assemblies.

In a further variation, a respective chamber can include a lower roof and an upper roof, and the lower roof is closer to the sidewall of the guide rail than the upper roof such that, when the slider slides to a position where the second end of the plunger is in contact with the lower roof, the first end of the plunger is allowed to move into the notch on the circuit board to lock the circuit board.

In a further variation, the first end of the plunger is allowed to move out of the notch on the circuit board to unlock the circuit board, when the slider slides to a position where the second end of the plunger is in contact with the upper roof.

In a further variation, the chamber can further include a ramp positioned between the lower roof and the upper roof.

In a further variation, an interface between the ramp and the lower roof can include a bump to prevent accidental sliding of the slider.

In a variation on this aspect, the plunger-and-spring assembly can further include a spring retainer positioned near the second end of the plunger.

In a further variation, the spring can be positioned between the spring retainer and the sidewall of the guide rail.

In a variation on this aspect, the apparatus can further include a pull rod attached to the slider. The pull rod is accessible at a front panel of a sub-assembly enclosing the circuit boards, thereby facilitating locking and unlocking of the circuit board using the pull rod.

In a variation on this aspect, the plunger can include metal (e.g., die-cast aluminum, die-cast zinc, etc.), and the slider can include plastic (e.g., polytetrafluoroethylene (PTFE) and polyvinyl chloride (PVC)).

One aspect of the instant application provides a circuit board sub-assembly. The circuit board sub-assembly can include a pair of guide rails to hold one or more circuit boards and a slider lock to lock the circuit boards in position. A respective circuit board comprises a notch on an edge adjacent to one guide rail. The slider lock can include a slider attached to a sidewall of the guide rail and allowed to slide along the guide rail within a predetermined range and one or more plunger-and-spring assemblies. A plunger-and-spring assembly corresponding to the circuit board can include a plunger and a spring surrounding the plunger. The plunger is inserted into a through-hole on the sidewall of the guide rail such that a first end of the plunger is aligned with the notch on the corresponding circuit board and a second end of the plunger is in contact with the slider. Sliding of the slider causes the spring to compress and decompress and causes the first end of the plunger to move in and out of the notch on the corresponding circuit board, thereby facilitating locking and unlocking of the corresponding circuit board.

The foregoing descriptions have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. An apparatus for locking one or more circuit boards in position between a pair of guide rails, the apparatus comprising:
   a slider attached to a sidewall of one guide rail, wherein the slider is allowed to slide along the guide rail within a predetermined range; and
   one or more plunger-and-spring assemblies, wherein a respective plunger-and-spring assembly comprises a plunger and a spring surrounding the plunger, wherein the plunger is inserted into a through-hole on the sidewall of the guide rail such that a first end of the plunger can be aligned with a notch on a corresponding circuit board and a second end of the plunger is in contact with the slider; and
   wherein sliding of the slider causes the spring to compress and decompress and the first end of the plunger to move in and out of the notch on the circuit board, thereby facilitating locking and unlocking of the circuit board.

2. The apparatus of claim 1, wherein the slider comprises one or more chambers for receiving the one or more plunger-and-spring assemblies.

3. The apparatus of claim 2, wherein a respective chamber comprises a lower roof and an upper roof, and wherein the lower roof is closer to the sidewall of the guide rail than the upper roof such that, when the slider slides to a position where the second end of the plunger is in contact with the lower roof, the first end of the plunger is allowed to move into the notch on the circuit board to lock the circuit board.

4. The apparatus of claim 3, wherein the first end of the plunger is allowed to move out of the notch on the circuit board to unlock the circuit board, when the slider slides to a position where the second end of the plunger is in contact with the upper roof.

5. The apparatus of claim 3, wherein the chamber further comprises a ramp positioned between the lower roof and the upper roof.

6. The apparatus of claim 5, wherein an interface between the ramp and the lower roof comprises a bump to prevent accidental sliding of the slider.

7. The apparatus of claim 1, wherein the plunger-and-spring assembly further comprises a spring retainer positioned near the second end of the plunger.

8. The apparatus of claim 7, wherein the spring is positioned between the spring retainer and the sidewall of the guide rail.

9. The apparatus of claim 1, further comprising a pull rod attached to the slider, wherein the pull rod is accessible at a front panel of a sub-assembly enclosing the circuit boards, thereby facilitating locking and unlocking of the circuit board using the pull rod.

10. The apparatus of claim 1, wherein the plunger comprises metal, and wherein the slider comprises plastic.

11. A circuit board sub-assembly, the sub-assembly comprising:
    a pair of guide rails to hold one or more circuit boards, wherein a respective circuit board comprises a notch on an edge adjacent to one guide rail; and
    a slider lock to lock the circuit boards in position, wherein the slider lock comprises:
      a slider attached to a sidewall of the guide rail and allowed to slide along the guide rail within a predetermined range; and
      one or more plunger-and-spring assemblies, wherein a plunger-and-spring assembly corresponding to the circuit board comprises a plunger and a spring surrounding the plunger, wherein the plunger is inserted into a through-hole on the sidewall of the guide rail such that a first end of the plunger is aligned with the notch on the corresponding circuit board and a second end of the plunger is in contact with the slider; and
      wherein sliding of the slider causes the spring to compress and decompress, and causes the first end of the plunger to move in and out of the notch on the corresponding circuit board, thereby facilitating locking and unlocking of the corresponding circuit board.

12. The circuit board sub-assembly of claim 11, wherein the slider comprises one or more chambers for receiving the one or more plunger-and-spring assemblies.

13. The circuit board sub-assembly of claim 12, wherein a respective chamber comprises a lower roof and an upper roof, and wherein the lower roof is closer to the sidewall of the guide rail than the upper roof such that, when the slider slides to a position where the second end of the plunger is in contact with the lower roof, the first end of the plunger is allowed to move into the notch on the circuit board to lock the circuit board.

14. The circuit board sub-assembly of claim 13, wherein the first end of the plunger is allowed to move out of the notch on the circuit board to unlock the circuit board, when the slider slides to a position where the second end of the plunger is in contact with the upper roof.

15. The circuit board sub-assembly of claim 13, wherein the chamber further comprises a ramp positioned between the lower roof and the upper roof.

16. The circuit board sub-assembly of claim 15, wherein an interface between the ramp and the lower roof comprises a bump to prevent accidental sliding of the slider.

17. The circuit board sub-assembly of claim 11, wherein the plunger-and-spring assembly further comprises a spring retainer positioned near the second end of the plunger.

18. The circuit board sub-assembly of claim 17, wherein the spring is positioned between the spring retainer and the sidewall of the guide rail.

19. The circuit board sub-assembly of claim 11, wherein the slider lock further comprises a pull rod attached to the slider, wherein the pull rod is accessible at a front panel of the circuit board sub-assembly, thereby facilitating locking and unlocking of the circuit board using the pull rod.

20. The circuit board sub-assembly of claim 11, wherein the guide rails are to hold multiple stacked Open Compute Project (OCP) host bus adaptor (HBA) boards.

* * * * *